United States Patent [19]

Head et al.

[11] Patent Number: 5,436,990
[45] Date of Patent: Jul. 25, 1995

[54] APPARATUS FOR COUPLING A MULTIPLE EMITTER LASER DIODE TO A MULTIMODE OPTICAL FIBER

[75] Inventors: David F. Head, Los Gatos; Thomas M. Baer, Mountain View, both of Calif.

[73] Assignee: Spectra-Physics Lasers, Inc., Mountain View, Calif.

[*] Notice: The portion of the term of this patent subsequent to Jun. 30, 2009 has been disclaimed.

[21] Appl. No.: 841,610

[22] Filed: Feb. 25, 1992

Related U.S. Application Data

[63] Continuation-in-part of Ser. No. 614,437, Nov. 16, 1990, Pat. No. 5,127,068.

[51] Int. Cl.⁶ ............................................. G02B 6/32
[52] U.S. Cl. ................................. 385/34; 385/74; 385/93; 385/137
[58] Field of Search ............... 385/34, 49, 52, 136, 385/137, 74, 93; 372/108, 71

[56] References Cited

U.S. PATENT DOCUMENTS 5,127,068  6/1992  Baer et al. ............................ 385/34

Primary Examiner—Rodney B. Bovernick
Assistant Examiner—Robert E. Wise
Attorney, Agent, or Firm—Haynes & Davis

[57] ABSTRACT

A small diameter multimode optical fiber with a low numerical aperture (i.e., 0.1) is used as a microlens to collimate the output emissions of a laser diode before butt coupling the output of the laser diode to an optical fiber. The optical fiber used as the microlens is chosen such that its diameter roughly equals the diameter of the fiber to be coupled to the laser diode. One end of the fiber is mounted in a fixed position and the other end of the fiber is slip fit into the end of a hollow receiving member mounted in a fixed position and running parallel to the axis of the fiber. The collimation is performed in the high NA direction of the output of the laser diode. The output of a bundle of butt coupled optical fibers may be used to pump a laser system.

31 Claims, 2 Drawing Sheets

APPARATUS FOR COUPLING A MULTIPLE EMITTER LASER DIODE TO A MULTIMODE OPTICAL FIBER

RELATED APPLICATIONS

This application is a CIP of co-pending application Ser. No. 07/614,437, filed Nov. 16, 1990, now U.S. Pat. No. 15,127,068.

BACKGROUND OF THE INVENTION

1. Field Of The Invention

The present invention relates to solid-state lasers. More specifically, the present invention pertains to laser diodes and coupling of laser diodes to multimode optical fibers.

2. The Prior Art

It is often necessary to couple a laser diode to a multimode optical fiber. The standard procedure is to butt couple the laser diode to the optical fiber, placing the optical fiber as close as possible to the emitting face of the laser diode. The output from a typical laser diode has very high angular divergence in the direction perpendicular to the diode junction, having a typical numerical aperture (NA) of 0.4 to 0.6. The numerical aperture is the sine of the half angle of the diode emission. The NA in the direction parallel to the junction is much smaller, typically 3 times less.

In order to couple efficiently to a laser diode, a multimode optical fiber must have an acceptance angle or NA comparable to the NA of the laser diode. A multimode optical fiber ideal for coupling to a laser diode would have an NA of 0.3 or above. Such a multimode optical fiber is somewhat difficult to design since it requires a cladding having a very low index of refraction. Moreover, since the energy emitted from the laser diode diverges rapidly, the end of the optical fiber must be placed very close to the diode facet to which it is to be coupled. Accurately achieving such placement requires very tight mechanical tolerances and can lead to practical fabrication problems due to optical feedback to the laser diode.

An object of the present invention is to provide a convenient means of coupling a low NA multimode optical fiber to a laser diode. The resulting low NA fiber output can have high brightness, where brightness is defined as W/cm$^2$/unit solid angle.

BRIEF DESCRIPTION OF THE INVENTION

A microlens, such as a small diameter multimode optical fiber is used to collimate the output emissions of a laser diode before butt coupling the output of the laser diode to an optical fiber. The optical fiber used as the microlens lens is chosen such that its diameter roughly equals the diameter of the fiber to be coupled to the laser diode. The collimation is performed in the high NA direction of the output of the laser diode.

For optimal coupling, the diameter of the butt coupled fiber diameter is preferably chosen to be 20 to 50% bigger than the lateral dimension of the laser diode of diode array. The diameter of the collimating microlens is then chosen to be roughly equal to this diameter. The NA of the butt coupled fiber is chosen to be roughly equal to the low NA direction of the diode, typically 0.1 to 0.2. The microlens and the butt coupled end of the fiber may be anti-reflection coated to reduce reflections off these surfaces. The microlens is oriented so as to collimate the high numerical aperture direction of the laser diode output.

In a presently preferred embodiment, the butt coupled fiber may be rectangular in shape so as to reduce the total amount of glass in the fiber. The width of the fiber is chosen to be slightly larger (about 20-50% larger) than the diode emitting area. The height is chosen to be as small as possible, typically around 30 to 50 microns. The diameter of the microlens should then be chosen to be approximately equal to the height of rectangle.

The arrangement of the present invention for precollimation of a diode emitter can be easily extended to a laser diode bar by extending the fiber precollimating lens along the length of the bar. An array of fibers, with spacing matching the diode separation on the bar, may be butt coupled to the diode bar resulting in very high efficiency coupling of diode bars to fiber arrays.

DETAILED DESCRIPTION OF A PREFERRED EMBODIMENT

It has been discovered that by using a microlens to collimate the laser diode before butt coupling to an optical fiber significantly improves coupling efficiently and permits the use of fibers with a low NA (0.1). Moreover, it has been discovered that a piece of multimode optical fiber can serve as an inexpensive microlens. The optical fiber should be chosen such that its diameter roughly equals the diameter of the optical fiber to be coupled to the laser diode. By collimating the high NA direction of the emission from a laser diode, the butt-coupled fiber may be located further away from the diode laser (it can now be spaced several hundred microns from the laser diode emitting surface) thus reducing the mechanical tolerances of the assembly.

In a presently preferred embodiment of the invention, the microlens is cylindrical in cross section. Those of ordinary skill in the art will recognize, however, that other cross sectional shapes, such as elliptical and hyperbolic, could prove to be useful in the present invention for correction of particular spherical aberrations as is known in the art, i.e. Kingsdale, Lens Design Fundamentals, Academic Press 1978.

The prior art arrangement for coupling the output of laser diode bar having a plurality of emitters into a plurality of optical fibers which may be part of a fiber bundle includes placing the end of each optical fiber very close to the diode facet to which it is to be coupled because the energy emitted from the laser diode diverges rapidly. Accurate placement of the fiber end relative to the laser diode requires very tight mechanical tolerances and thus leads to practical fabrication problems.

In addition, the output from a typical laser diode has very high angular divergence in the direction perpendicular to the diode junction, having a typical NA of 0.5 to 0.6. The NA in the direction parallel to the junction is much smaller, typically 3 times less. A multimode optical fiber having an NA to ideally match the laser diode output would require a cladding having a very low index of refraction. It is difficult to produce such a fiber.

The present invention solves these practical problems and provides a solution which avoids the critical placement problems of the prior art arrangement, and allows utilization of readily available multimode optical fibers.

Figure 1:
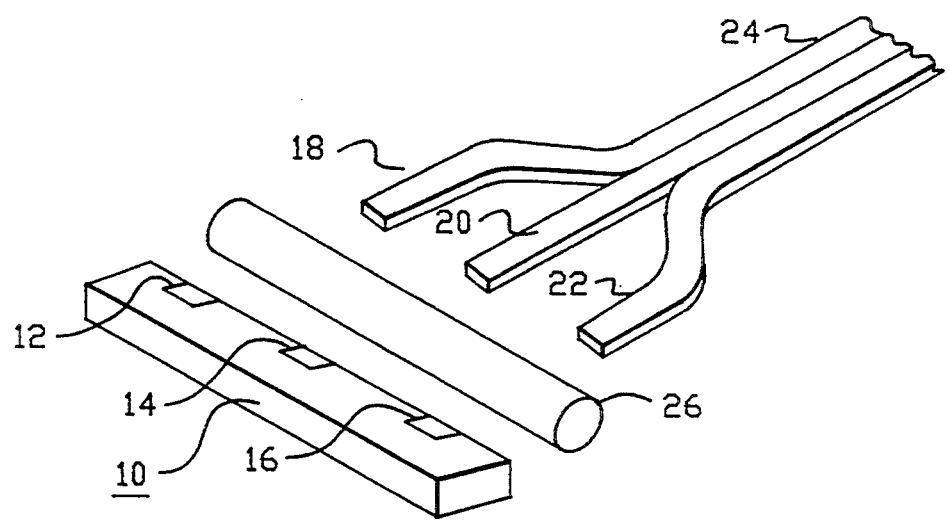
FIG. 1 is a perspective view of an arrangement according to the present invention for coupling the output from a laser diode bar into an optical fiber bundle.

Referring first to FIG. 1, an arrangement according to the present invention for coupling the radiation emitted from laser diode bar 10, having a plurality of emitters 12, 14, and 16, into multimode optical fibers 18, 20, and 22, which may be part of an optical fiber bundle 24 includes placing a microlens 26 in between the emitting facets of emitters 12, 14, and 16, and the ends of multimode optical fibers 18, 20 and 22. The optimal spacing of the microlens 26 from the emitting surfaces of the emitter facets may be determined by the following equation: $d = R(2-n)/2(n-1)$, where d is the distance from the laser diode to the lens, n is the index of refraction of the optical fiber lens, and R is the radius of the optical fiber. A distance of approximately 60 microns from the near edge of the microlens to the diode facet is satisfactory for a 250 micron diameter fiber having an index of refraction of 1.5. The optimal spacing of the optical fiber end from the microlens should be as small as possible.

Imagings other than collimation may sometimes be desirable and are intended to fall within the scope of the present invention. For example, it may be advantageous to refocus the highly divergent emission from a laser diode emitter in order to stay within the aperture of a small diameter or rectangular optical fiber to which the laser diode radiation is to be coupled. The various diode-to-lens spacing distances d and other setup parameters for such applications may readily be determined by those of ordinary skill in the art by reference to widely available works, such as F. Jenkins and H. White, Fundamentals of Optics, McGraw-Hill, 4th ed. 1976, Chapter 3, pp. 44–57.

For optimal coupling, the diameter of the optical fiber to be coupled is typically chosen to be 20 to 50% bigger than the lateral dimension of the laser diode of diode array. For example given a laser diode array having a 200 micron broad area emitter, the optical fiber is chosen to be approximately 250 microns in diameter.

In a presently preferred embodiment, the diameter of microlens 26 is chosen to be roughly equal to the diameter of the optical fiber to be coupled. The diameter of microlens 26 may be chosen to be less than the diameter of the optical fiber to be coupled without loss in coupling efficiency. However, if such smaller microlens diameters are used, the alignment of the microlens will be made more difficult.

Microlens 26 must be carefully placed with respect to the output facets of the laser diode bar in order to properly collimate them. This may be accomplished by carefully aligning the microlens and securing it in place with a suitable epoxy such as Tra-Bond BB-2151 available from Tra-Con in Medford Mass.

The NA of the optical fiber to be coupled is chosen to be roughly equal to the low NA direction of the diode, typically 0.1 to 0.15. This combination of microlens and optical fiber results in greater than 80% coupling of the laser diode emitted energy into the multimode optical fiber. The microlens and the butt coupled end of the fiber may be anti-reflection coated to reduce reflections from these surfaces.

As is shown in FIG. 1, the optical fibers 18, 20, and 22 may be rectangular in cross section so as to reduce the total amount of glass in the fiber. The width of such a rectangular fiber is preferably chosen to be slightly bigger than the diode emitting area. The height is chosen to be as small as possible, typically around 30 to 50 microns. Heights smaller than 30 to 50 microns may be used but make alignment difficult. The diameter of the microlens 26 is then preferably chosen to equal the height of the rectangle, 30 to 50 microns in the example given. The resulting fiber output is brighter since the total emission area is smaller.

Figure 2:
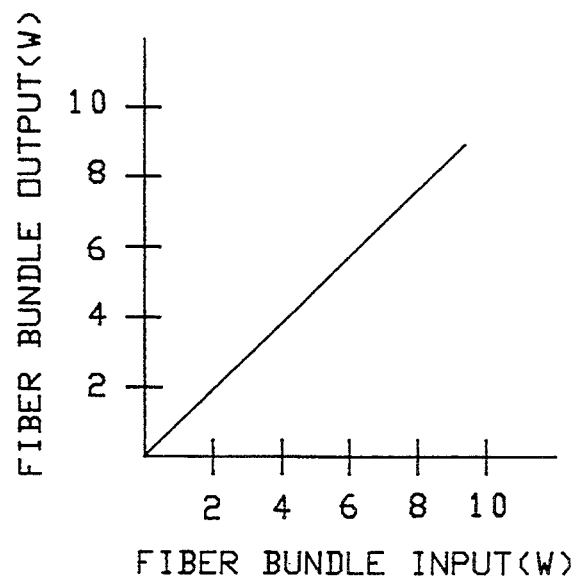
FIG. 2 is graph showing the output power from a fiber bundle as a function of the input power to the fiber bundle in a system using the present invention.

As illustrated in FIG. 1, the arrangement of the present invention for precollimation of a single laser diode emitter can be easily extended to a laser diode bar containing a plurality of laser diode emitters by extending the microlens 26 along the length of the bar to intercept the output radiation from the multiple emitters along the length of the bar. An array of optical fibers, with spacing matching the diode separation on the bar, can be efficiently butt coupled to the laser diode bar 10, resulting in very high coupling of diode bars to fiber arrays. In the example given above, ten 1 watt laser diode emitters contained on a 1 cm diode bar, each emitter having a 200 micron wide emission region, available from Spectra Diode Labs of San Jose, Cal., were coupled to a fiber array including 10 optical fibers, each having a 250 micron diameter and an output NA of 0.11, by use of a 250 micron diameter optical fiber lens spaced approximately 50 microns from the emitting surfaces of the diodes and about 300 microns from the ends of the optical fibers. The overall coupling efficiency of this arrangement was measured at about 90% as shown by the graph of FIG. 2.

The output diameter of the resulting fiber bundle is about 1 mm and the NA is 0.11. If smaller diameter emission regions are needed (for example, 0.33 mm, to pump a solid state laser) then the emitting face of the fiber optic bundle can be demagnified by using a simple high NA lens, as will be appreciated by those of ordinary skill in the art, to suitably reduce the diameter of the image of the output of the fiber bundle.

The present invention is useful for a variety of applications. One such application is as a pump source for a laser system. As an example, FIG. 3 is a block diagram illustrating how the present invention may be used as a pump source for a solid state laser, although those of ordinary skill in the art will realize that the present invention is adaptable for pumping other kinds of laser systems in other manners without departing from the concept of the invention.

Figure 3:
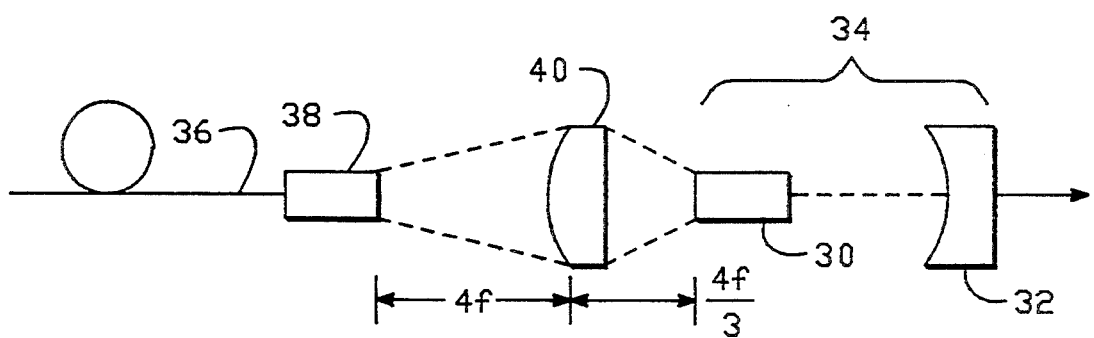
FIG. 3 is a block diagram of an embodiment of the present invention used as a pump source for a laser system.

Referring now to FIG. 3, a bar 30 of doped solid state laser material and an output coupler 32 form a laser cavity 34. As will be appreciated by those of ordinary skill in the art, the end of laser cavity 34 may be a highly reflective coating on the face of the bar 30. An optical fiber bundle 36, into which laser diode radiation has been coupled, terminates in an output coupler 38, as is well known in the art. An imaging lens 40, having a focal length f, is placed in the optical path of radiation from the optical fiber bundle 36, at a distance 4f from the surface of the output coupler 38 and at a distance 4f/3 from the face of the bar 30 forming one end of the laser cavity 34. Those of ordinary skill in the art will recognize that other distances may be employed depending on the optical coupling desired. The particular distances employed in particular embodiments depend entirely on the optical coupling desired and selection of particular distances to achieve particular ends is well within the level of ordinary skill in the art.

Those of ordinary skill in the art will recognize the geometry disclosed in FIG. 3 as an end-pumped cavity geometry, but such persons will immediately recognize that the arrangement disclosed with respect to FIG. 3 could easily be used for side pumping a laser cavity with minimal and trivial rearrangement.

An important consideration in the design of high-energy output optical systems of the nature described herein is the positional stability of the optical components over the temperature ranges expected to be encountered during normal system operation. The thermal characteristics of optical fibers such as those suitable for use as fiber lenses in the present invention are such that the fiber lens may tend to bow during thermal cycling if it is mounted with both of its ends fixed. Given the small spacings between the optical elements in a typical system in which the present invention may be utilized, even small amounts of bow due to thermal excursions can be intolerable. According to another aspect of the present invention, an optical fiber lens according to the present invention may be mounted in a manner which avoids the problems caused by thermal expansion during operation.

Figure 4:
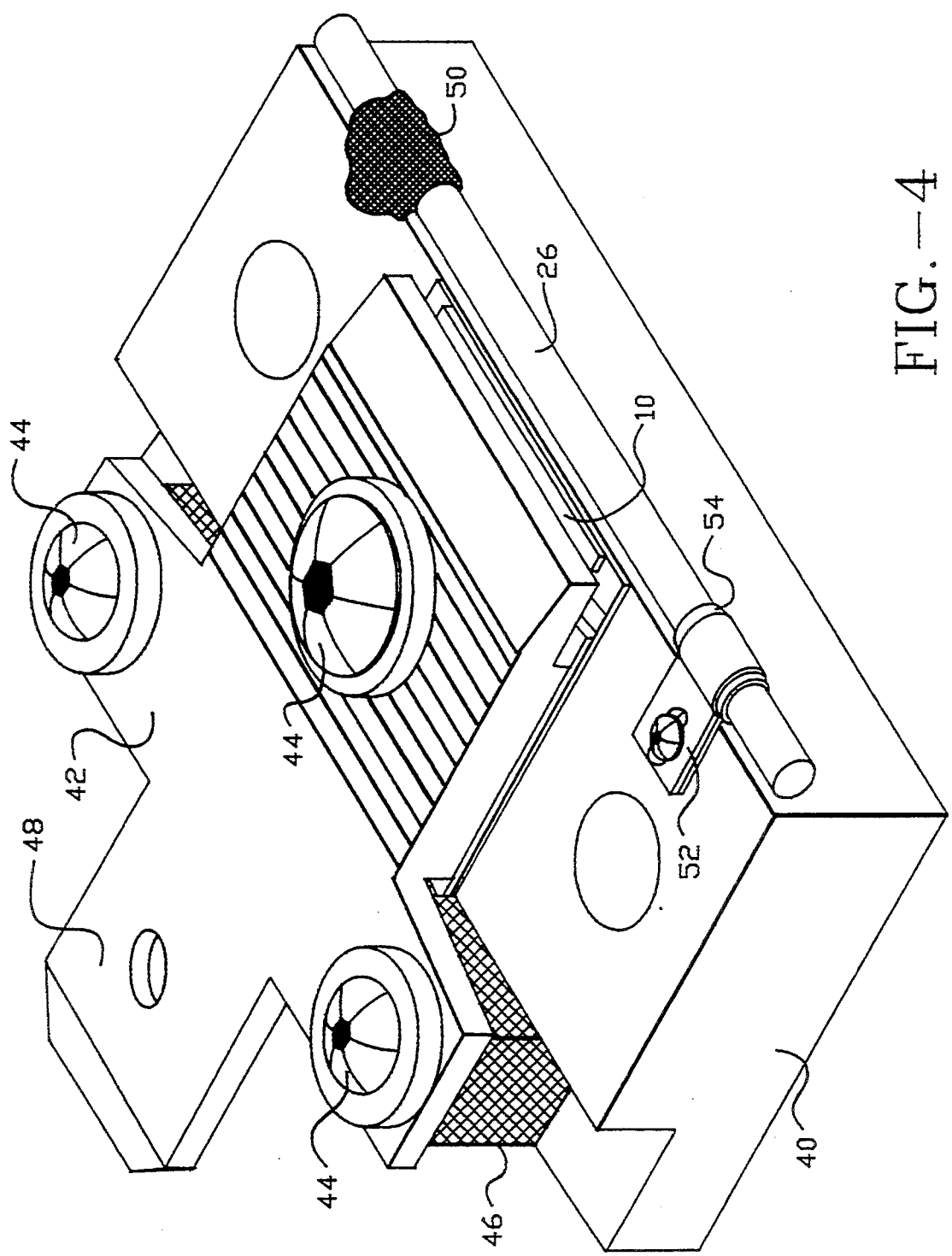
FIG. 4 is a perspective view of a presently preferred embodiment of an arrangement according to the present invention for coupling the output from a laser diode bar into an optical fiber bundle.

Referring now to FIG. 4, a perspective view of a presently preferred embodiment of a optical fiber mounting arrangement according to the present invention for coupling the output from a laser diode bar into an optical fiber bundle is shown. In the embodiment of FIG. 4, an assembly configured according to the present invention includes a laser diode bar 10 disposed on a mounting member 40. As is known in the art, mounting member 40 may comprise a material suitable for providing heat transfer from laser diode bar 10, and is preferably formed from a material having a thermal expansion coefficient matching that of laser diode bar 10. Laser diode bar 10 is clamped down to mounting member 40 by a contact plate 42 held in place by fastening means such as the three screws 44 shown in FIG. 4. A spacer 46 is provided at the rear of clamp member 42. The rear portion of clamp member 44 is shown shaped as a spade terminal 48, providing a convenient way to supply a power supply potential to the laser diode bar 10.

A first end of optical fiber lens 26 may be held in a fixed position at a selected distance from the emitting faces of laser diode bar 10 by one of any number of well known fastening means, including, but not limited to, a pressure clamp (not shown), a dab of epoxy resin 50, such as Tra-Con 2151, available from TraCon, Incorporated, of Medford, Mass. The other end of optical fiber lens 26 is slidably mounted along its axis. This may be accomplished in a number of ways.

As illustrated in FIG. 4, a cylindrical clamp 52, is furnished with an inner sleeve 54, which may be formed from a length of hollow precision bore tubing. The tubing may be made of quartz, sapphire, polyimide, etc. Suitable tubing may be purchased from Polymicro Technologies of Phoenix, Ariz. The outside diameter of the optical fiber should match the inside diameter of the tubing. Cylindrical clamp 52 is affixed to mounting member 40 in a position such that the axis of the cylindrical aperture of cylindrical clamp 52 and inner sleeve 54 lies along the axis of optical fiber lens 26. The second end of optical fiber lens 26 is thus slidably positioned in the cylindrical aperture of cylindrical clamp 52. Alternatively, a first end of optical fiber 26 may be affixed to mounting member 40 with a dab of non-wetting or non-adhering adhesive. When hardened, the adhesive will restrict the motion of the fiber to a direction along its axis.

By mounting the optical fiber lens 26 as taught herein, a thermally stable configuration is achieved. This allows reliable operation of the optical system over a greater temperature range.

A presently preferred embodiment of the invention has been disclosed. From the disclosure in conjunction with the drawings, those of ordinary skill in the art will be able to make changes and modifications to the specifically described embodiments without departing from the scope of the invention which is intended to be limited only by the scope of the appended claims.

What is claimed is:

1. In combination:
   a laser diode bar having a plurality of emitter regions;
   a microlens comprising an optical fiber having a linear axis oriented substantially perpendicular to and positioned in the emission path of radiation from said emitter regions to be optically coupled thereto and spaced therefrom by a distance selected to achieve a desired imaging, a first end of said optical fiber mounted in a fixed position with respect to said laser diode bar;
   slip-fit mounting means for adapted to receive and hold a second end of said optical fiber such that said optical fiber remains substantially on said axis as its length varies due to thermal expansion and contraction;
   a plurality of optical fibers equal to the number of emitter regions of said laser diode bar, and oriented on axis with respect to said microlens such that radiation from said individual ones of said emitter regions is optically coupled into individual ones of said plurality of optical fibers.

2. The combination of claim 1 wherein said microlens is substantially cylindrical in cross section and has a diameter chosen to be about 20% to 50% larger than the lateral dimension of said emitter regions.

3. The combination of claim 2 wherein the diameter of each one of said plurality of optical fibers is chosen to be about equal to the diameter of said cylindrical microlens.

4. The combination of claim 2 wherein said cylindrical microlens has an anti-reflective coating.

5. The combination of claim 1 wherein said microlens has a cross sectional shape selected to correct a selected spherical aberration and with an effective aperture approximately the same size as each one of said plurality of optical fibers, said microlens placed at a distance from the output facets of the emitters on the diode bar, said distance selected to achieve a desired imaging.

6. The combination of claim 5 wherein said distance is approximately one focal length of said microlens.

7. The combination of claim 1 wherein the numerical aperture of each one of said plurality of optical fibers is chosen to be about equal to the numerical aperture in the low numerical aperture direction said emitter regions.

8. The combination of claim 7, wherein the numerical aperture of each one of said optical fibers is chosen to be between about 0.1 to 0.2.

9. The combination of claim 1 wherein said microlens is an optical fiber.

10. The combination of claim 1, further including a focussing lens at the far end of said plurality of optical fibers.

11. The combination of claim 1 wherein said slip-fit mounting means comprises a receiving member fixedly mounted with respect to said laser diode bar, said receiving member including a recess therein oriented on said axis, said recess holding said second end of said optical fiber.

12. The combination of claim 11 wherein said receiving member comprises a precision sleeve.

13. The combination of claim 1 wherein said distance is approximately one focal length of said microlens.

14. In combination:
a laser diode bar having a plurality of emitter regions;
a cylindrical microlens comprising an optical fiber having a linear axis positioned in the emission path of radiation from said emitter regions and spaced therefrom by a distance approximately equal to $R(2-n)/2(n-1)$, where R is the radius of and n is the index of refraction of said microlens, a first end of said optical fiber mounted in a fixed position with respect to said laser diode bar;
slip-fit mounting means for adapted to receive and hold a second end of said optical fiber such that said optical fiber remains substantially on said axis as its length varies due to thermal expansion and contraction;
a plurality of optical fibers equal to the number of emitter regions of said laser diode bar, and oriented on axis with respect to said microlens such that radiation from said individual ones of said emitter regions is optically coupled into individual ones of said plurality of optical fibers.

15. The combination of claim 14 wherein said microlens is substantially cylindrical in cross section and has a diameter chosen to be about 20% to 50% larger than the lateral dimension of said emitter regions.

16. The combination of claim 14 wherein said microlens has a cross sectional shape selected to correct a selected spherical aberration and has an effective diameter approximately equal to the diameters of each of said plurality of optical fibers to be coupled.

17. The combination of claim 14 wherein the diameters of each of said optical fibers to be coupled is chosen to be about equal to the diameter of said cylindrical microlens.

18. The combination of claim 17, wherein the numerical aperture of each of said plurality of optical fibers is chosen to be between about 0.1 to 0.2.

19. The combination of claim 14 wherein the numerical aperture of said optical fibers is chosen to be about equal to the numerical aperture in the low numerical aperture direction of said emitter regions.

20. The combination of claim 14 wherein said optical fibers are rectangular in cross section an have a width chosen to be larger than the emitting area of said emitter regions and have a height of between about 30 to 50 microns.

21. The combination of claim 14 wherein said microlens has an anti-reflective coating.

22. The combination of claim 14 further including a focussing lens at the far end of said plurality of optical fibers.

23. The combination of claim 14 wherein said slip-fit mounting means comprises a receiving member fixedly mounted with respect to said laser diode bar, said receiving member including a recess therein oriented on said axis, said recess holding said second end of said optical fiber.

24. The combination of claim 23 wherein said receiving member comprises a precision sleeve.

25. A diode pumped laser system, including:
cavity forming means, including an active laser medium;
a laser diode bar having a plurality of emitter regions;
a microlens comprising an optical fiber having a linear axis oriented substantially perpendicular to and positioned in the emission path of radiation from said emitter regions to be optically coupled thereto and spaced therefrom by a distance of approximately one focal length of said microlens, a first end of said optical fiber mounted in a fixed position with respect to said laser diode bar;
slip-fit mounting means for adapted to receive and hold a second end of said optical fiber such that said optical fiber remains substantially on said axis as its length varies due to thermal expansion and contraction;;
a plurality of optical fibers equal to the number of emitter regions of said laser diode bar, each of said plurality of optical fibers having a first end and a second end, each of said first ends oriented on axis with respect to said microlens such that radiation from said individual ones of said emitter regions is optically coupled into individual ones of said plurality of optical fibers, said second ends of each of said plurality of optical fibers arranged in a bundle;
means for optically coupling radiation from said bundle into said laser cavity.

26. A diode pumped laser system, including:
cavity forming means, including an active laser medium;
a laser diode bar having a plurality of emitter regions;
a microlens comprising an optical fiber having a linear axis oriented substantially perpendicular to and positioned in the emission path of radiation from said emitter regions to be optically coupled thereto and spaced therefrom by a distance of approximately one focal length of said microlens, a first end of said optical fiber mounted in a fixed position with respect to said laser diode bar;
slip-fit mounting means for adapted to receive and hold a second end of said optical fiber such that said optical fiber remains substantially on said axis as its length varies due to thermal expansion and contraction;;
a plurality of optical fibers equal to the number of emitter regions of said laser diode bar, each of said plurality of optical fibers having a first end and a second end, each of said first ends oriented on axis with respect to said microlens such that radiation from said individual ones of said emitter regions is optically coupled into individual ones of said plurality of optical fibers, said second ends of each of said optical fibers arranged in a bundle,
means for optically coupling radiation from said bundle into one end of said laser cavity.

27. A diode pumped laser system, including:

a bar of active solid state laser material disposed in a laser cavity having opposing ends, one face of said bar forming a first one of said opposing ends;

a laser diode bar having a plurality of emitter regions;

a microlens comprising an optical fiber having a linear axis oriented substantially perpendicular to and positioned in the emission path of radiation from said emitter regions to be optically coupled thereto and spaced therefrom by a distance selected to achieve a desired imaging, a first end of said optical fiber mounted in a fixed position with respect to said laser diode bar;

slip-fit mounting means for adapted to receive and hold a second end of said optical fiber such that said optical fiber remains substantially on said axis as its length varies due to thermal expansion and contraction;;

a plurality of optical fibers equal to the number of emitter regions of said laser diode bar each of said optical fibers having a first end and a second end, each of said first ends oriented on axis with respect to said microlens such that radiation from said individual ones of said emitter regions is optically coupled into individual ones of said fibers, said second ends of each of said optical fibers arranged in a bundle;

means for optically coupling radiation from said bundle into said first end of said laser cavity.

28. A method of coupling the output of a laser diode emitter region into the end of an optical fiber including the steps of:

mounting along a linear axis spaced from said laser diode a microlens comprising an optical fiber, said microlens spaced from said laser diode by about $R(2-n)/2(n-1)$, where R is the radius of and n is the index of refraction of said microlens, said microlens having a diameter about 20% to 50% larger than the lateral dimension of said emitter region, said microlens mounted such that a first one of its ends is in a fixed position and a second one of its ends is slidable along said linear axis;

optically coupling the output radiation of said laser diode emitter region into said microlens;

optically coupling the output radiation of said microlens into the end of an optical fiber, said optical fiber having a diameter about equal to the diameter of said microlens, said end of said optical fiber spaced as close as possible to said microlens, said optical fiber having a numerical aperture about equal to the numerical aperture of said emitter region of said laser diode in its low direction.

29. The method of claim 28 including the further step of optically coupling a focussing lens to the far end of a plurality of said optical fibers arranged as a bundle of optical fibers.

30. A method of coupling the output of the emitter regions of a plurality of laser diodes into a fiber optic bundle including the steps of:

mounting along a linear axis spaced form said laser diode a microlens comprising an optical fiber, said microlens spaced from said emitter regions by about $R(2-n)/2(n-1)$, where R is the radius of and n is the index of refraction of said microlens, said microlens having a diameter about 20% to 50% larger than the lateral dimension of said emitter region, said microlens mounted such that a first one of its ends is in a fixed position and a second one of its ends is slidable along said linear axis;

optically coupling the output radiation of said each of said emitter regions into a different region of said microlens;

separately optically coupling the output radiation of said microlens corresponding to the output of each of said emitter regions into the ends of different ones of a plurality of optical fibers, each of said optical fibers having a diameter about equal to the diameter of said microlens, the ends of said optical fibers spaced as closely as possible to said microlens, said optical fibers having a numerical aperture about equal to the numerical aperture of said emitter regions of said laser diode in its low direction.

31. A method for mounting a microlens comprising an optical fiber for collimating the output radiation from at least one laser diode emitter, comprising the steps of:

providing a fixed mount for a first end of said optical fiber in a position along a linear axis perpendicular to the axis of emission from said at least one laser diode emitter, said linear axis spaced from the face of said at least one laser diode emitter by a distance selected to achieve maximum collimation of said emission; and providing a slidable mount for a second end of said optical fiber along said linear axis perpendicular to said axis of emission such that said optical fiber may slide with respect to said slidable mount along said linear axis.

* * * * *